United States Patent
Gammel et al.

(10) Patent No.: US 9,356,604 B2
(45) Date of Patent: *May 31, 2016

(54) INTEGRATED CIRCUIT AND METHOD FOR MANUFACTURING THE SAME

(71) Applicant: INFINEON TECHNOLOGIES AG, Neubiberg (DE)

(72) Inventors: Berndt Gammel, Markt-Schwaben (DE); Thomas Nirschl, Putzbrunn (DE); Gerd Dirscherl, Munich (DE); Philip Schlazer, Munich (DE); Stefan Rueping, Lengdorf (DE)

(73) Assignee: Infineon Technologies AG, Neubiberg (DE)

( * ) Notice: Subject to any disclaimer, the term of this patent is extended or adjusted under 35 U.S.C. 154(b) by 341 days.

This patent is subject to a terminal disclaimer.

(21) Appl. No.: 13/775,789

(22) Filed: Feb. 25, 2013

(65) Prior Publication Data

US 2013/0176053 A1    Jul. 11, 2013

Related U.S. Application Data

(63) Continuation of application No. 12/761,812, filed on Apr. 16, 2010, now Pat. No. 8,384,429.

(51) Int. Cl.
*H03K 19/20* (2006.01)
*G11C 13/00* (2006.01)
*H01L 27/24* (2006.01)

(52) U.S. Cl.
CPC ............ *H03K 19/20* (2013.01); *G11C 13/0004* (2013.01); *H01L 27/24* (2013.01)

(58) Field of Classification Search
None
See application file for complete search history.

(56) References Cited

U.S. PATENT DOCUMENTS

| | | |
|---|---|---|
| 4,799,125 A | 1/1989 | Crofts et al. |
| 4,807,081 A | 2/1989 | Crofts et al. |
| 4,809,044 A | 2/1989 | Pryor et al. |
| 5,543,737 A | 8/1996 | Ovshinsky |
| 5,694,054 A | 12/1997 | Ovshinsky et al. |
| 5,757,446 A | 5/1998 | Ovshinsky et al. |
| 6,189,582 B1 | 2/2001 | Reinberg et al. |
| 6,232,893 B1 | 5/2001 | Cliff et al. |
| 6,809,425 B1 | 10/2004 | Chen et al. |
| 6,972,427 B2 | 12/2005 | Roehr et al. |
| 6,990,017 B1 | 1/2006 | Parkinson et al. |
| 7,026,840 B1 | 4/2006 | May et al. |
| 7,099,227 B1 * | 8/2006 | Zhou ............... H03K 19/17748 326/40 |
| 7,105,408 B2 | 9/2006 | Dennison |
| 7,365,355 B2 | 4/2008 | Parkinson |
| 7,385,429 B1 | 6/2008 | Mei et al. |

(Continued)

FOREIGN PATENT DOCUMENTS

| | | |
|---|---|---|
| DE | 10 2005 018 344 A1 | 12/2005 |
| DE | 10 2005 015 614 A1 | 10/2006 |
| DE | 10 2007 033 250 A1 | 8/2008 |

OTHER PUBLICATIONS

Kenneth E. Van Landingham; "Circuit Applications of Ovonic Switching Devices"; IEEE Transactions on Electron Devices, vol. Ed-20, No. 2, Feb. 1973, pp. 178-187.

*Primary Examiner* — Crystal L Hammond
(74) *Attorney, Agent, or Firm* — Schiff Hardin LLP

(57) ABSTRACT

An integrated circuit has one or more logic gates and a control circuit. The control circuit has one or more control elements coupled to the logic gates. The control circuit controls the states of the one or more logic gates.

40 Claims, 6 Drawing Sheets

(56) References Cited

U.S. PATENT DOCUMENTS

| | | |
|---|---|---|
| 7,453,285 B2 | 11/2008 | Kiel et al. |
| 7,463,057 B1 | 12/2008 | Rahim et al. |
| 7,499,315 B2 | 3/2009 | Lowrey et al. |
| 7,539,046 B2 | 5/2009 | Lai et al. |
| 7,545,019 B2 | 6/2009 | Philipp et al. |
| 7,719,318 B1 | 5/2010 | Nordquist et al. |
| 8,384,429 B2 * | 2/2013 | Gammel ............ G11C 13/0004 326/101 |
| 2004/0252544 A1 | 12/2004 | Lowrey et al. |
| 2006/0279328 A1 | 12/2006 | Kozicki et al. |
| 2007/0045771 A1 | 3/2007 | Philipp et al. |
| 2007/0105267 A1 | 5/2007 | Karpov et al. |
| 2009/0128189 A1 * | 5/2009 | Madurawe ....... H03K 19/17796 326/41 |
| 2009/0251172 A1 | 10/2009 | Choi et al. |
| 2009/0303782 A1 | 12/2009 | Lowrey |
| 2010/0038625 A1 * | 2/2010 | Bertin ................ B82Y 10/00 257/9 |
| 2010/0072957 A1 * | 3/2010 | Bertin ................ B82Y 10/00 320/166 |

* cited by examiner

INTEGRATED CIRCUIT AND METHOD FOR MANUFACTURING THE SAME

RELATED APPLICATION INFORMATION

This application is a continuation of U.S. patent application Ser. No. 12/761,812, filed on Apr. 16, 2010. U.S. patent application Ser. No. 12/761,812 is hereby incorporated by reference herein.

BACKGROUND

Embodiments of the invention relate to an integrated circuit, a chip and a method for manufacturing the integrated circuit.

SUMMARY OF THE INVENTION

Embodiments of the invention relate to an integrated circuit that comprises a logic gate, and a control circuit coupled to the logic gate, the control circuit controlling the state of the logic gate. The control circuit may comprise one or more control elements. The one or more control elements comprise one or more programmable resistance elements and/or one or more threshold switching elements. In one or more embodiments, the integrated circuit may comprise a plurality of logic gates. The control circuit may control the states of a plurality of logic gates.

BRIEF DESCRIPTION OF THE DRAWINGS

Embodiments of the invention will be explained in the following with reference to the accompanying drawings, in which.

Before embodiments of the invention are explained on the basis of the drawings in greater detail in the following, it is to be pointed out that like elements in the figures are provided with the same or similar reference numerals, and that a repeated description of these elements is omitted.

DETAILED DESCRIPTION OF THE INVENTION

Figure 1:
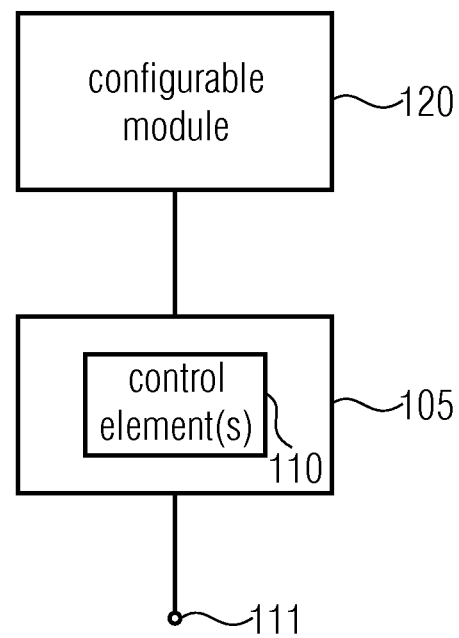
FIG. 1 is a schematic view of an integrated circuit according to an embodiment of the invention.

Embodiments of the invention address several aspects.

A first aspect (a) concerns disabling (blocking) modules that are needed only during manufacturing of chips and/or for testing purposes may thereafter be blocked. In addition, by blocking modules it is possible to allow for different product variants within the same device.

In conventional methods modules no longer required are in general not blocked. However, the possible access to an unblocked module in the field may be a security risk as it may allow enabling a functionality that is not desired. Further, any access to such modules may result in an unpredictable behavior of the overall device. A conventional approach for blocking the functionality of such a module is the use of a register (stored e.g. on a SRAM chip) that holds the necessary data for blocking the module. However, such a register needs to be initialized upon starting the module. However, after power up or reset the register content may be incorrect or may be corrupted. Therefore, after start up the module cannot be used correctly (e.g. with an undesired, normally disabled functionality) so that it is required to load the correct data into the register. This requires the storing of the required information, e.g. in a flash memory cell. Storing the redundant information increases the overhead. Instead of using a register, the module may be blocked on the basis of data obtained from a flash/EEPROM memory (EEPROM=electrically erasable programmable read-only memory). While this avoids the problem of corrupted data, the data is not immediately available after power since the flash/EEPROM memory is not immediately useable due to the required charge pumps. Also, the need to provide a charge pump increases area consumption and also increases the overhead.

A second aspect (b) concerns the configuration of a logic circuit in the field or during the manufacture thereof (e.g. in the backend of processing). The function of a logic gate and its connection to devices may, for example, be configured by the content/state of a memory element and/or threshold switching element.

Conventionally modules may be configured by changing or adapting electrical connections or data paths, thereby allowing the configuration of a device comprising a plurality of modules for different applications or algorithms. However, configuring data paths using flash cells is slow due to the long programming time for the flash/EEPROM cells. In addition, the number of configuration changes is severely limited due to the limited cycle ability of flash or EEPROM cells.

The conventional configuration during the chip production usually involves application specific integrated circuits (ASIC) and/or gate arrays. ASICs are configurable to a large extent, as neither the logic gate nor its connections are predefined. The disadvantage is however that, for the configuration, many layer levels during the chip productions become configuration specific, which also generates high manufacturing costs. In case of gate arrays, the logic gates are already pre-processed and hence fixed, and only the connection between the different gates can be configured. Since only a few layer levels are required for this, the costs can be smaller compared to the ASIC approach.

A third aspect (c) concerns the field of security and the possibility of camouflage of control elements for logic circuits.

Logic functions of a digital electronic circuitry may often be recovered by reverse engineering, i.e. by analyzing the logic function of a gate and its connections the logic behavior of the whole circuitry may be discovered. For security relevant applications, the possibility of reverse engineering is not acceptable, as the function of the circuitry must remain confidential. There are several known concepts for the camouflage of logic, which may be divided into two groups:

(i) The gate function is disguised, for example, by using identical layouts for different gates, by burying the connections within the gate, etc.

(ii) Disguising the gate connections, for example, by using buried connections.

In general, measures against analyzing comprise the drawback that the area of the circuitry is increased. For instance, if different gates (e.g. an inverter and a XOR-gate) comprise the same layout, the area of the circuit becomes larger than necessary. An inverter, for instance, is normally much smaller than a XOR-gate, but due to their identical layout, the same amount of area is required for each of them.

Therefore, there is a need for connecting, configuring, blocking, or enabling of modules or logic gates to overcome the drawbacks of the known methods.

Embodiments of the invention comprise a control circuit comprising one or more control elements coupled to the module or to a logic gate, the control circuit controlling the states of the module or the logic gate. The control circuit comprises the one or more control elements. Embodiments use two types of control elements: a programmable resistive element and/or a threshold switching element. In one or more embodiments, one or more of the control elements may each be a programmable resistance element. In one or more embodiments, one or more of the control elements may each be a threshold switching element. A control circuit may comprise at least one programmable resistance element and/or at least one threshold switching element.

A programmable resistance element may be programmable between at least a first resistance state and a second resistance state. The first resistance state may, for example, be a higher resistance state and the second resistance state may be a lower resistance state. In one or more embodiments, a programmable resistive element may be a phase-change memory element comprising a phase-change material. In one or more embodiments, the phase-change material may comprise a chalcogenide material.

In one or more embodiments, a programmable resistance element may be a conductive bridging memory element. The conductive bridging memory element may comprise a solid electrolyte material. A solid electrolyte material may include a metal oxide. In one or more embodiments, the metal oxide may include a nickel oxide. In one or more embodiments, the conductive bridging material may be a chalcogenide material. In one or more embodiments, the chalcogenide material used as a conductive bridging material may not be a phase-change material.

In one or more embodiments, a threshold switching element may be a chalcogenide threshold switching element including a chalcogenide material. In one or more embodiments, the chalcogenide material of the chalcogenide threshold switching element may not be a phase-change material.

In one or more embodiments, a threshold switching element may be an ovonic threshold switch (also referred to as an OTS). The ovonic threshold switch may comprise an amorphous material. The amorphous material may be switchable between a high resistance (or high ohmic) state and a low resistance (or low ohmic) state. In one or more embodiments, the ovonic threshold switch may comprise a chalcogenide material. In one or more embodiments, the chalcogenide material of the ovonic threshold switch may not be a phase-change material.

Hence, in one or more embodiments, a control element may be a phase-change memory (PCM) element. In one or more embodiments, a control element may be an ovonic threshold switch (OTS). In one or more embodiments, a control circuit may include at least one phase-change memory element and/or at least one ovonic threshold switch.

Phase-change memory elements comprise a phase-change material. A phase-change material may be programmable between a crystalline phase and an amorphous phase so that the resistivity of the material may be made to change by causing a phase transition from the crystalline phase to the amorphous phase and vice versa. Correspondingly the phase-change memory element comprises at least two states, for example one high ohmic (e.g., amorphous) and one low ohmic (e.g., crystalline) state. The change between the states may be initiated by different signals. For example, to program (or switch) from the amorphous to the crystalline state a long signal (set signal) with low current may be applied. In one or more embodiments, it should be long enough that the atoms can form a crystal structure. On the other hand, the programming (or switching) from the crystalline to the amorphous phase may be done by a short signal (reset signal) with high current. In this case, the current may be high enough in order to heat the material sufficiently (the crystal structure disappears) and the cooling occurs quickly so that no crystal forms during the cooling. Examples for possible time periods and the currents are: for the reset signal about 300 . . . 800 µA for about 50 ns (or within the range between 10 ns and 80 ns), and for the set signal about 50 . . . 150 µA for about 100 ns (or within the range between 60 ns and 300 ns). During the programming of the phase-change memory (PCM) element both a high electrical current density and a steep temperature gradient may occur.

Possible materials to be used in phase-change memory elements as well as OTS elements may be chalcogenide materials. The chalcogenide material used in a phase-change memory element may be different from that used in an ovonic threshold switch. In one or more embodiments, the chalcogenide material used in an ovonic threshold switch may not be a phase-change material.

Chalcogenide materials may be in the form of alloys. Chalcogenide materials may include (for example, in the form of alloy) one or more of the chalcogen elements from Group VI of the Periodic Table of Elements. Examples of chalcogen elements which may used include selenium (Se) and tellurium (Te)). An example of a chalcogenide material which may be useful as a phase-change memory material may be $Ge_2Sb_2Te_5$. In one or more embodiments, it is possible that a phase-change memory element may include a phase-change material which is not a chalcogenide material.

In one or more embodiments, phase-change memory elements may be used as memory elements that store digital non-volatile information within a phase-change material. In this case, the function of the logic gate may be determined by the state or the phase of the memory element. An advantage is that the memory elements are very small, and hence, its state or its phase is difficult to analyze and hence avoids aforementioned problems of aspects (a) to (c).

In one or more embodiments, a programmable resistance element may comprise a programmable resistance material which is not necessarily a phase-change material. In one or more embodiments, a programmable resistance material may comprise a metal oxide. In one or more embodiments, the metal oxide may be a nickel oxide.

Ovonic threshold switches (OTS) may comprise a voltage dependent resistance. More especially, after reaching a threshold voltage the resistance of the element may rapidly change (e.g. drop by many magnitudes). In one or more embodiments, an OTS may have an S-type current-voltage characteristic curve. In one or more embodiments, the OTS may be used as additional logic components for logic devices (OTS logic). The OTS logic may be processed at the backend of line (e.g. within oxide layers of a MOS-device), and hence, is arranged above an exemplary silicon substrate comprising further logic components. This is an advantage of OTS logic. The logic within the substrate (silicon logic) and the OTS logic define together the total logic function. The logic components within the substrate are therefore hidden by the OTS logic. In case of reverse engineering both logic components have to be analyzed resulting in an increased effort needed for analyzing.

Hence, embodiments may be used to address the third aspect (c), i.e. to implement a camouflage logic in order to block the analysis of the gate functions or the connections between the gates, or at least to make the analysis very complex and difficult (and thereby very expensive).

According to embodiments addressing the aspect (b), the control elements using phase-change memory (PCM) elements (or some other type of programmable resistance elements) or threshold switching elements such as ovonic threshold switches (OTS) as part of the circuitry may be programmed in the field. Its configuration may also be changed in the field.

The phase-change memory elements may have certain advantages. They may be immediately operable after the reset/power up due to the low reading voltage. The configuration may be quickly changed and they may be non-volatile.

It is also of advantage that PCM elements and/or OTS may be processed in the backend of line production, meaning that after forming the devices in the substrate, the amorphous switching element can be arranged within a dielectric layer formed on the substrate of a device (e.g. using MOS technology). This also means that they may be added to an existing logic or to an existing gate array. Therefore, a vertical arrangement will also reduce at the same time the chip area significantly.

As said before, OTS may for instance be used for configuration during chip production. In contrast to the gate array, connections and additional logic functions can be processed in the backend production. Alternatively, only by adding the OTS logic to CMOS transistors, a useable logic function may emerge.

Embodiments of the invention will now described with the accompanying drawings.

FIG. 1 shows a circuitry according to embodiments of the invention, wherein only a schematic view is shown. The circuitry comprises a control circuit 105 connected between a configuration terminal 111 and a configurable module 120. The configurable module 120 may be a configurable circuit such as a configurable logic circuit. The configurable module 120 may be adapted to perform at least one predefined operation, which for example may comprise a certain logic function. The configurable module 120 may be a logic gate or may comprise one or more logic gates. The configurable module 120 may be or may include a logic circuit comprising at least one (or, in some embodiments, at least two) of electrically coupled logic gates. The control circuit 105 may control the function (e.g. the logic function) of the configurable module 120. For example, the control circuit 105 may control the logic of one or more of the logic gates within the configurable module 120 and/or the control circuit 105 may control the connectivity between two or more of the logic gates within the configurable module 120. In one or more embodiments, the control circuit 105 may block or enable the function or operation of the configuration module 120. In one or more embodiments, the control circuit 105 may change or modify the function or operation of the configurable module 120.

The control circuit 105 includes one or more control elements 110. In one or more embodiments, the control elements 110 may include at least one programmable resistance element and/or at least one threshold switching element. Hence, for example, a control element 110 may be a programmable resistance element (such as a phase-change memory element) or a control element 110 may a threshold switching element such as an ovonic threshold switch. In one or more embodiments, the control circuit may include a plurality of control elements 110 which are electrically coupled together.

In the embodiment shown, the control circuit 105 includes at least a control element 110 that may be coupled between the module 120 and the configuration terminal 111. In one or embodiments, the control element 110 may be a programmable resistance element comprising a material programmable or switchable between a first resistance state and a second resistance state. The programming or switching may be in response to a configuration signal. This signal may occur at the configuration terminal 111. In the first state, at least one operation of the module may be disabled or blocked. In the second state At least one operation of the module may be enabled. In the simplest case, the operation is just to provide a connection between an input and an output of the module 120, whereas in another example the operation is a specific logic operation (see below for detailed examples). In one embodiment, the programmable resistance element may be a phase-change memory element. In one or more embodiments, phase-change memory element may be programmed back and forth between an amorphous state or phase and a crystalline state or phase. In one or more embodiments, a phase-change memory element may be operated in a binary mode having two resistance states. In one or more embodiments, a phase-change memory element may be operated in a multi-state mode having more that two resistance states.

In another embodiment, the control element 110 may represent a threshold switch such as an ovonic threshold switch which can be switched between a high resistance state and a low resistance state.

The module 120 may comprise, for example, a circuitry or device arranged over (including on) or within a substrate. The control element 110 may be arranged vertically above the substrate (e.g. within one or more dielectric layers). For example, in an embodiment, the control element 110 may be arranged between the substrate and metallization level 1 (e.g. metal-1). In an embodiment, the control element 110 may be disposed between two metallization levels (such as metal-1 and metal-2, metal-2 and metal-3, etc.).

The module 120 may be adapted to be completely blocked if the at least one predefined operation is blocked. For example, if the module 120 is a test module needed only during manufacturing, the module 120 may be blocked completely after manufacturing. The control element 110 may be an OTS element, so that the switching occurs only after reaching a threshold value, e.g., for the applied electric current.

Figure 2:
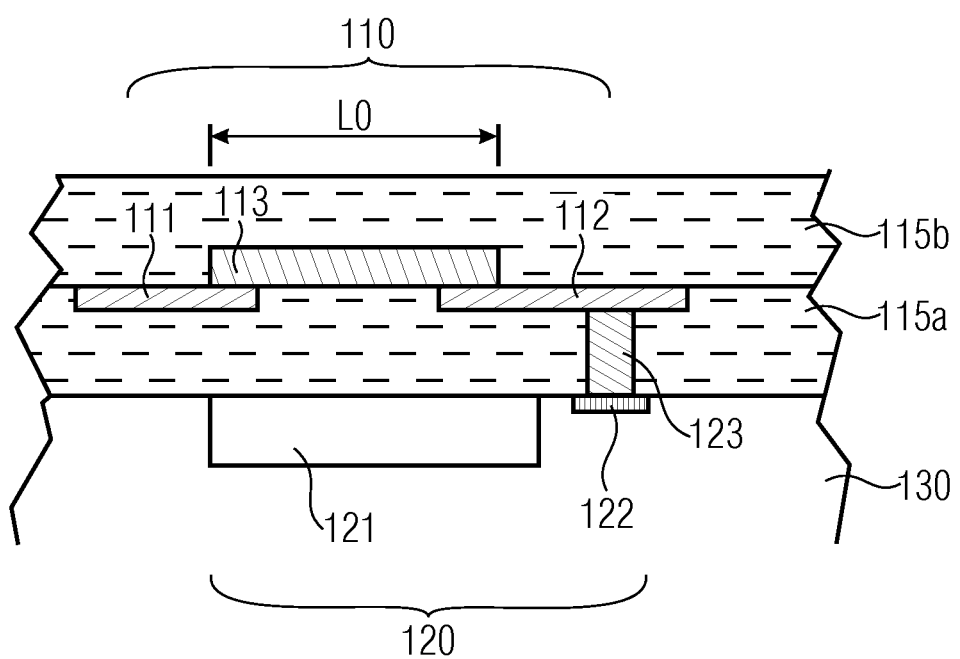
FIG. 2 shows a chip comprising an integrated circuit according to an embodiment of the invention.

FIG. 2 shows an embodiment in greater detail, in which a chip is formed as a MOS-device (MOS=Metal-Oxide-Semiconductor). The chip comprises a semiconductor substrate 130 with the device 120 forming a configurable module. A dielectric layer structure 115 is formed on the substrate 130. A phase-change memory element forms the control element 110 and is arranged within the dielectric layer structure 115. The substrate 130 may be a silicon substrate. The device 120 comprises a doped region 121 within the semiconductor substrate 130 and a contact region 122, which is adapted to provide an electrical connection for the device 120. The dielectric layer structure 115 comprises a first part 115a and a second part 115b such that the first part 115a is arranged between the substrate 130 and the second part 115b (e.g. on the device 120). Within the dielectric layer structure 115 conductive layers 111, 112 may be arranged (e.g. the standard metal layers of MOS-devices), wherein two of these conductive layers are used as the first connector 111 and the second connector 112 that contact the phase-change memory element 110 (also referred to as PCM element 110) such that the first connector 111 and the second connector 112 are electrically connected by the phase-change material 113 comprising a length LO along a current path between the first connector 111 and the second connector 112.

A via connection 123 connects the contact region 122 and the second connector 112 to provide a signal path from the phase-change memory element 110 to the device 120. In the embodiment as shown in FIG. 2, the first and second connectors 111, 112 are arranged along the interface between the first part 115a and the second part 115b of the dielectric layer 115 so that the via connection 123 provides a (vertical) connection through the first part 115a. In addition, the first connector 111 is adapted to provide the configuration terminal 111 for the PCM element 110. Hence, by a configuration signal at the configuration terminal 111 the phase-change material 113 may change between an amorphous phase and a crystalline phase. In addition, the phase-change material 113 may comprise a symmetric or an asymmetric shape as shown in FIG. 3b below, when viewed from the topside (opposite to the substrate 130).

Arranging the phase-change memory element 110 within the dielectric layer structure 115 of the MOS-chip provides for the possibility of hiding the functionality of the chip, e.g. if the device 120 is underneath the PCM element 110 as shown in FIG. 2. It is also possible to hide the PCM element 110 (or alternatively the OTS) within oxide layers (or dielectric layers) of an MOS-type field effect transistor (e.g. MOSFET, CMOS, NMOS, etc.), wherein the standard metal layers of the MOS structure provide the terminals (e.g. the configuration terminal 111) or electric connections for the PCM element 110. Hence, a monolithic integration within a single chip is achieved. This is advantageous in security-related applications (security chips), wherein concrete connections and/or switching behavior between different devices should remain hidden so that the layout will not be compromised.

In other embodiments the phase-change memory element 110 is replaced by an OTS, which may be part of a logic circuit realized in part in the substrate 130. In such an embodiment the phase-change material 113 may be replaced by a threshold switching material (such as a chalcogenide threshold switching material) and the device 120 (e.g. the configurable module) may be a logic device such that the desired logic behavior results only from the combination the OTS-element 110 and the device 120. The phase-change memory element 110 may also be arranged vertically, i.e. parallel to the via connection 123.

Figure 3A:
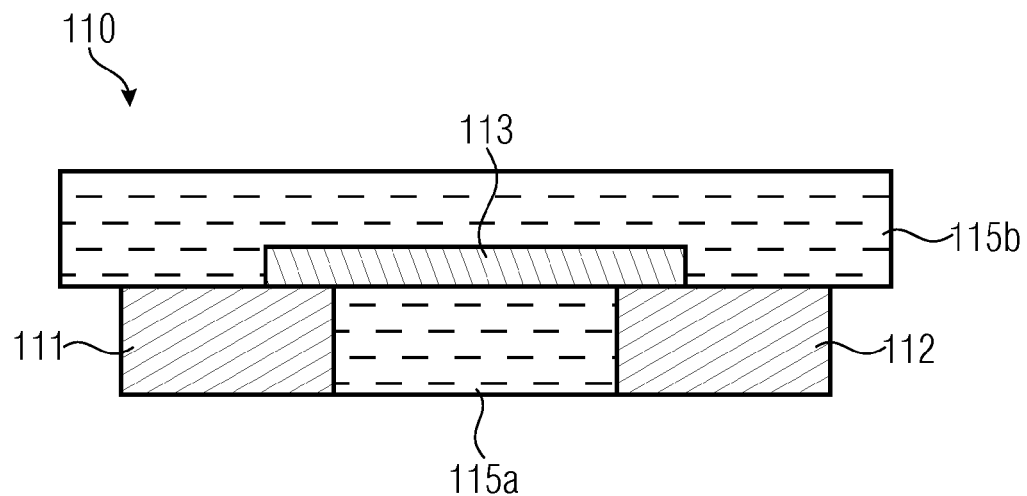
FIGS. 3a and 3b show a cross-sectional and an overview of a phase-change memory element.
Figure 3B:
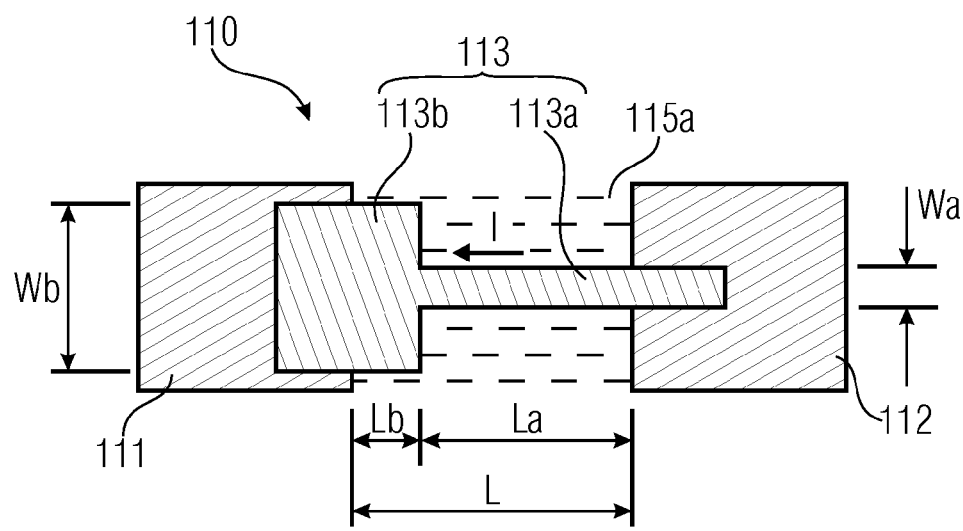

FIGS. 3a and 3b show views of the phase-change memory element 110 comprising a first connector 111 and a second connector 112 electrically coupled to a phase-change material 113.

FIG. 3a is a cross-sectional view of the element 110 and shows that a first portion of the dielectric layer 115a is arranged between the first and second connector 111 and 112, and that a second portion of the dielectric layer 115b is arranged on the phase-change material 113, on the first connector 111 and on the second connector 112. Depending on the shape of the phase-change material 113, symmetric and asymmetric phase-change memory elements may each be realized.

FIG. 3b shows a top view on an asymmetric phase-change memory element 110. Only the first portion of the dielectric layer 115a underneath the phase-change material 113 is visible. The phase-change material 113, whose asymmetric form is visible in this view, bridges the first connector 111 and the second connector 112. If a voltage is applied between the first and the second connector 111,112 an electric current along a current path I will be generated. The asymmetric form of the phase-change material is such that the cross-sectional area perpendicular to the current path I changes along the current path I. In the embodiments shown in FIG. 3b the phase-change material 113 is T-shaped (defining a T-element), i.e., the cross section of the phase-change material 113 increases stepwise from the second connector 112 towards the first connector 111. In other embodiments also funnel shaped phase-change material 113 (with a continuously increasing cross section along the current path I) may be used.

As consequence, the T-shaped phase-change material 113 comprises a small region 113a (with a smaller cross-sectional area) and an enlarged region 113b (with an increased cross-sectional area). Along the current path I, the first and second connector 111, 112 are separated by a distance L, which is bridged by the phase-change material 113 such that the small region 113a extends over a first length La with a first width Wa, and the enlarged region 113b extends over a second length Lb with a second width Wb (so that L=La+Lb). The T-shape may imply that the first connector 111 is contacted with the enlarged region 113b and that the second connector 112 is contacted with the small region 113a. The first length La may, for example, comprise a value between 300 nm and 800 nm, and the first width may comprise a minimal value between 100 nm and 400 nm or between 110 nm and 300 nm.

In other embodiments symmetric phase-change memory elements are used, which are left right symmetric (i.e. symmetry under exchange of the first and the second connector 111, 112). Hence, in symmetric PCM-elements a further enlarged region of the phase-change material 113 may be at the second connector 112 and both the enlarged region 113b and the further enlarged region are connected by the small region 113a.

Figure 4A:
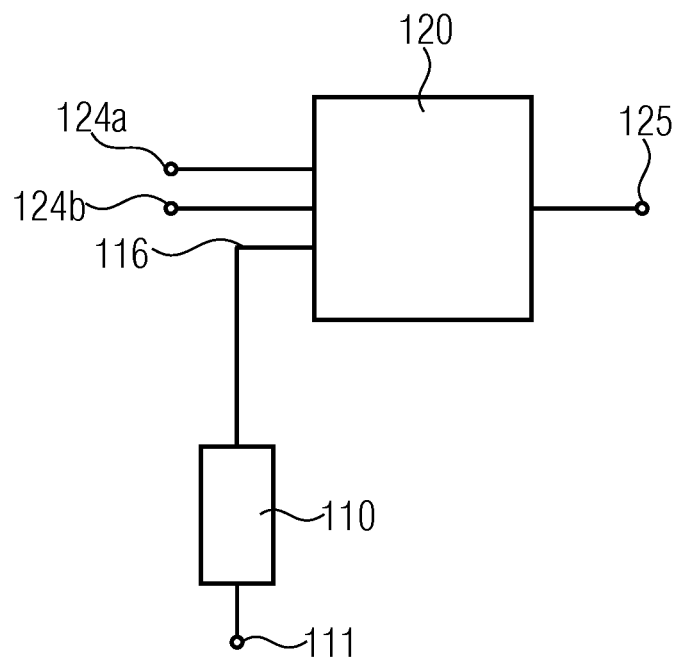
FIGS. 4a and 4b show a schematic view of an integrated circuit according to another embodiment of the invention.
Figure 4B:
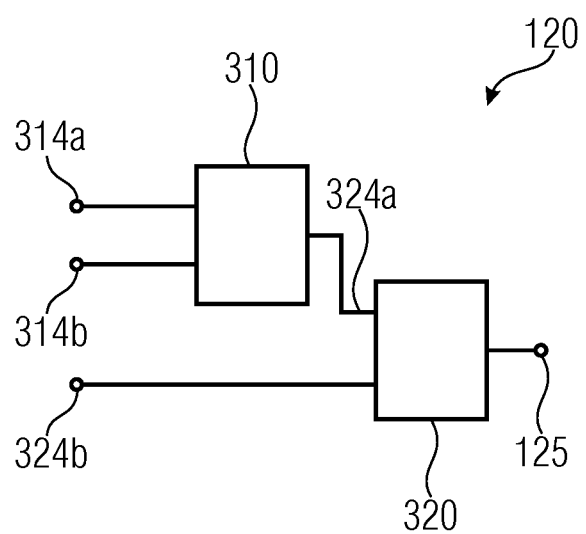

FIGS. 4a and 4b show a configurable module/device (which may, for example, be a configurable logic circuit) having a configurable logic gate 120 and the control element 110 that is used to define the logic function of the configurable logic gate 120.

In the embodiment shown in FIG. 4a, configurable module 120 (which may, for example, be a logic circuit) is a logic gate 120. The logic gate comprises a first input 124a, a second input 124b, a configuration input 116, and an output 125. The control element 110 is connected between the configuration terminal 111 and the configuration input 116 of the logic gate 120. The control element 110 may be a phase-change memory element, such that it's state or phase defines an input signal at the configuration input 116. For example, in one state (phase) of the phase-change memory element 110 the input signal at the configuration input 116 is a logic "1", or vice-versa, if the phase-change memory element 110 is in the other state (phase), a logic "0" is at the configuration input 116. Depending on the input signal (true or false, or logic "1" or logic "0") at the configuration input 116, the logic gate 120 is configured to perform different logic operations, for instance, acting as an AND-gate in one case, or as an OR-gate in the other case (between the first and second inputs 124a,b and the output 125).

FIG. 4b shows the configurable module 120 (which may, for example, be a logic circuit) having a plurality of different electrically coupled logic gates. The configurable module 120 comprises a first logic gate 310 and a second logic gate 320. The first logic gate 310 comprises a first input 314a and a second input 314b. The second logic element 320 comprises also a first input 324a and a second input 324b. In addition, the first logic gate 310 comprises an output, which is connected to the first input 324a of the second logic gate 320, and the second logic gate 320 comprises the output 125. The first and second input 314a, 314b of the first logic gate 310 may comprise the first and second input 124a and 124b of the configurable module 120 and the second input 324b of the second logic gate 320 may be the configuration input 116 of the configurable module 120. In other embodiments, the first and second inputs 124a and 124b and the configuration input 116 may be chosen differently, so that one of the three inputs shown in FIG. 4b becomes the configuration input 116 and the remaining two form the first and second input 124b and 124b. Referring to FIG. 4b, it is possible that the input 324b functions as a configuration input that changes the logic function of the logic gate 320 and thus changes the logic function of the logic circuit 120.

In another embodiment, it is possible that a control circuit including at least one control element be used to change the connectivity between two or more logic gates. For example, in some embodiments, the control circuit or control element may be used to de-couple a first logic gate from a second logic gate (or from some other part of a circuit). Or, in some embodiments, the control circuit or control element may be used to couple a first logic gate to a third logic gate (or to some other part of a circuit). This type of operation and use of the control circuit may also be used to change the function (e.g. the logic function) of a configurable module such as a logic circuit.

Other embodiments comprise an XOR-gate with three inputs, in which case a phase-change memory element 110 is coupled to one of the three inputs. For example, if the state of the PCM-element 110 is a logic 0 an XOR-gate with two inputs emerges, and in case the state of the PCM-element 110 is a logic 1, an XNOR-gate with two inputs emerges. Other possibilities may be realized by different logic gates. For example, it is possible to use two PCM-elements 110 for a logic gate, thus generating up to four logic functions, or generally for n PCM-elements up to $2^n$ different logic gate functions (configuration possibilities) may be generated with the same layout.

Further embodiments use OTS elements instead of PCM-elements. Especially in complex logic gates, in which two or more transistors are connected in series, the transistor/logic functions can be implemented alternatively in silicon, or by OTS elements.

Figure 5A:
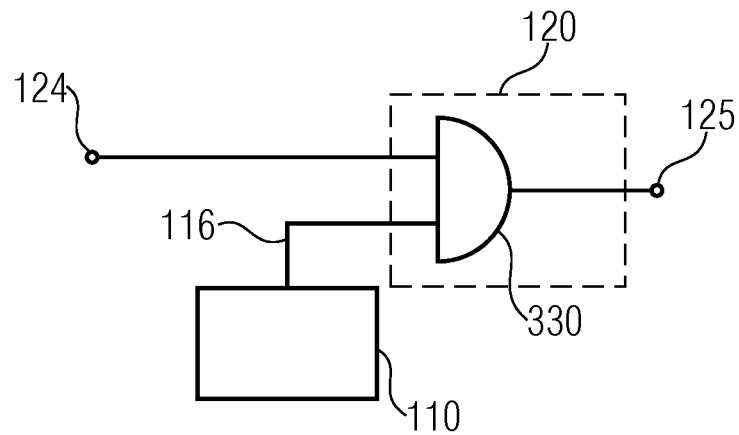
FIGS. 5a to 5c show schematic views of an integrated circuit according to yet other embodiments of the invention.
Figure 5B:
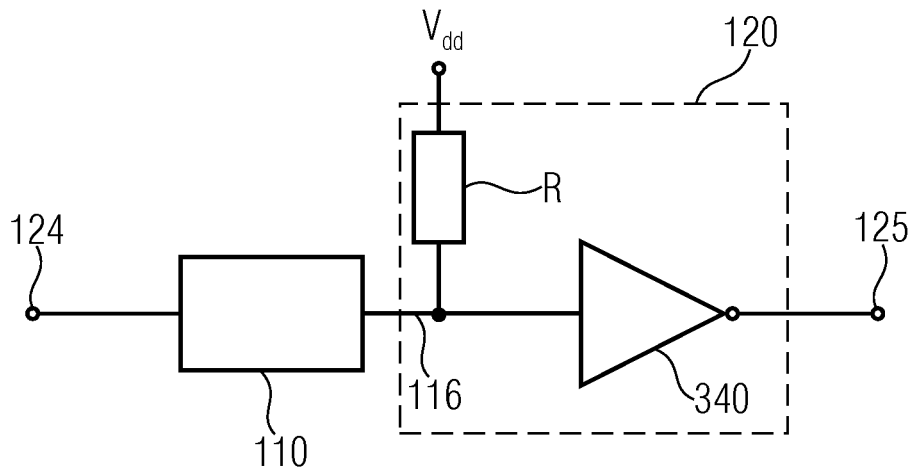
Figure 5C:
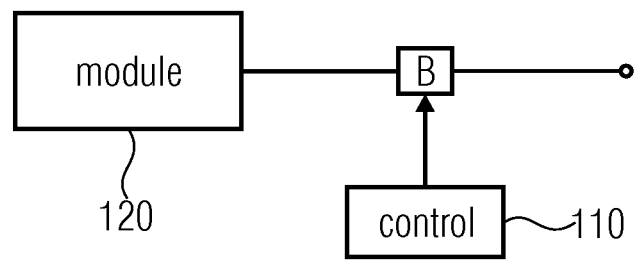

FIGS. 5a to 5c show yet further embodiments of a circuitry used for blocking or enabling an access to a module.

In FIG. 5a the configurable module 120 comprises as an example an AND-gate 330 with a first input 124 and a second input 116. The AND-gate 330 comprises an output 125. The control 110 may in this embodiment comprise a PCM-element yielding a logic 0, or a logic 1, depending on the state of the memory element 110. In order to generate the logic 0 or the logic 1 the PCRAM-element 110 may comprise a further input, for example, for a voltage supply. For simplicity this further input is not shown in FIG. 5a. In addition, in this embodiment the PCM-element 110 already comprises an output circuitry, which yields only a logic value 0, or a logic value 1 (when in operation).

In case the PCM-element 110 yields a logic 0, the AND-gate 330 will output a value at the output 125, which is a logic 0 independently of the value at the input 124. Hence, the connection between the input 124 and the output 125 is blocked. Therefore, the circuitry as shown in FIG. 5a, may block a further module, which may be connected to the input 124, or to the output 125.

On the other hand, if the PCM-element 110 provides the logic value 1, this value will be input into the AND-gate 330 at the input 116 and thus the signal at the output 125 will coincide with the signal at the input 124. As a consequence, a connection between the input 124 and the output 125 is established and the further module connected to the input 124 or to the output 125 may now be accessed.

In FIG. 5a the configuration terminal 111 is also omitted, but may provide an additional terminal to the PCM-element 110 and which may be configured to change the state of the PCM-element 110. But since the state of PCM-element 110 can be fixed already during manufacturing without the need for any subsequent changes, the configuration terminal 111 may not be needed anymore and hence may be absent.

FIG. 5b shows another embodiment, wherein the module 120 comprises an inverter 340, and a resistor R. The control element 110 may comprise a phase-change memory element that is connected in series between an input 124 and the configuration input 116 of the module 120. The module 120 comprises a further input connected to a voltage supply $V_{dd}$, such that the resistor R is connected between the voltage supply $V_{dd}$ and the configuration input 116. The inverter 340 is connected between the configuration terminal 116 and an output 125. In this embodiment the phase-change memory element 110 acts like a resistor, whose behavior depends on the programming state. The PCM-element 110 is either in the high ohmic or in the low ohmic state. The resistance of the resistor R is adjusted such that it is on one hand significantly higher than the resistance of the PCM-element 110 in the low ohmic state, and on the other hand the resistance of the resistor R is significantly lower than the resistance of the PCM-element 110 in the high ohmic state. The resistance of the resistor R may be fixed such that it comprises a value, which is approximately in the middle between the high and low ohmic states.

When the phase-change memory element 110 is in the high ohmic (or high resistance) state, a high level is present at the configuration input 116. The high level at configuration input 116 is fixed by the pull up resistor R. The lower the resistance of the resistor R, the closer the high level at the configuration input 116 is to the voltage supply $V_{dd}$. The higher the resistance of the resistor R, the more the high level deviates from the voltage supply $V_{dd}$. As a consequence, the logic value at the output 125 of inverter 340 is a logic 0 value (a positive logic is assumed) regardless of the value at the input 124. Hence, the connection between input 124 and the output 125 is severed or blocked since the value at input 124 does not affect the value at output 125. This may be used to block an additional circuit or module coupled to either the input 124 or the output 125. In one or more embodiments, the signal path may be along the lower voltage drop from the configuration terminal 116 (either over the resistor R or over the PCM-element 110).

When the phase-change memory element 110 is in a low ohmic state, there will be a low ohmic connection from the configuration input 116 to the input 124. The input 124 will be connected to the output 125 and a signal placed at the input 124 will be inverted at the output 125.

In FIG. 5c a blocking circuit is shown for blocking an output of a module 120 that may be part of a larger entity, e.g. an electronic circuit or the like. The module may be a module used during manufacturing of the electronic circuit to test a functionality of the electronic circuit or a part thereof. After manufacturing such modules may no longer needed and need to be disconnected from the rest of the electronic circuit. To allow for this blocking, a blocking element B is provided in the signal path between the module 120 and other element of the electronic circuit. The blocking element may comprise an element that interrupts the signal output path of the module 120 in response to a control signal from the control element 110. Possible control elements are such that were already described above. Alternatively, the blocking element can be used to enable for the electronic circuit additional functionality provided by the module. In such a case blocking element may comprise an element that closes the signal output path of the module 120 that was originally interrupted in response to a control signal from the control element 110.

The embodiments as shown in FIGS. 5a to 5c may for example be applied for blocking or enabling specific modules or circuitries (such as logic modules or logic circuitries). In one or more embodiments, modules or circuitries may, for example, comprise a scan path, a LBIST (Logic Built-In Self-Test) controller, a MBIST (Memory Built-In Self-Test) controller, a calibration or test register, etc. There is no need to access calibration registers after testing if a non-volatile memory is used to store the calibration value. PCM-element may also store this information.

The embodiments as shown in FIGS. 4a,b and 5a,b,c may also be implemented within a MOS-chip as shown before, namely be forming the PCM element 110 at least partly within a standard oxide layer or a dielectric layer structure of a MOS-chip (see FIG. 2).

Embodiments also comprise a method for manufacturing a chip. The method comprises forming a device 120 within a substrate 130, forming a dielectric layer structure 115 on the substrate 130, and forming a control element 110 at least partly within the dielectric layer structure 115. The control element 110 comprises a first connector 111 (configuration terminal), a second connector 112 (output terminal) and a material 113 switchable between a first and a second phase by applying a switch signal at the configuration terminal 111. The method further comprises connecting the control element 110 with the device 120 within the substrate 130. The method optionally further comprises applying the switch signal to fix the phase of the material 113 of the control element 110. The method optionally further comprises a testing of the circuitry and a step of blocking the device 120 by switching the amorphous switching element 110.

The logic achieved by embodiments of the invention comprises advantages in that it allows a much higher logic density, because PCRAM-elements are small and relatively less expensive. PCRAM-elements need only a very low programming voltage and especially do not need an increased reading voltage. As a consequence no charge pumps are needed, or at least become much smaller so that cost advantages are possible, especially in cases where the configurable logic blocks are very small (e.g. in the case of embedded configurable logic). The configurable logic is thus after power up immediately useable.

Hence, in comparison to conventional devices comprising logic gates, which were configured in the field by so-called field programmable gate arrays (FPGAs), which used, for instance, SRAM or flash/EEPROM cells, embodiments of the invention avoid the known drawbacks. Recall, SRAM cells are relatively large and thus expensive, and the content of a element (defining the configuration) has to be loaded at power up of the chip, for which typically a flash device was used yielding a time delay. Neither were field programmable gate arrays based on flash/EEPROM cells immediately useable after power up, as they typically need a higher read voltage. The high read voltage had to be generated by so-called charge pumps resulting also in a delay of a couple of microseconds and, in addition, need further chip area. Especially for small field programmable gate arrays (e.g. embedded FPGAs) this generates additional costs. Hence, embodiments overcame these drawbacks.

The control element 110 may comprise a PCM- or an OTS-element, wherein also the OTS-elements may be formed at the backend of manufacturing (at the backend of line), in which case the device 120 may already be formed within the substrate 130. The control element 110 may be formed together with the dielectric layers and with the electric connections. As the before, it is also possible to define the logic, e.g., be using PCRAM-elements, whereby the functionality of the logic is configured during chip production.

The PCRAM-elements can be configured, either during chip manufacturing, but also in the field. In this case, logic blocks as they are known from FPGAs can be used. But these logic blocks are not configured by SRAM or flash cells, but rather by PCRAM-elements. The same holds for connections between logic blocks or for connections, data paths, and busses between modules, which in conventional methods were configured by using register or SRAM elements. Instead, in case there is no need to configure the modules in the field, PCRAM-elements are programmed during the chip manufacturing by applying the program-voltage from outside (to bring the PCM-element 110 in a predefined state), or alternatively programming them. In this case, charge pumps may be completely avoided (are not needed).

As the before, yet another advantage is that the logic can be hidden if phase-change materials are used (camouflage logic). For example, OTS elements are rather small and can be hidden within dielectric layer structures of MOS (CMOS) devices, and thus are difficult to detect. Further, the control elements may be placed at randomly selected locations within the integrated circuit. E.g., during the layout process specific locations not used for the logic gates may be selected (preferably randomly) for placing the one or more control elements.

In one or more embodiments, the control circuit and control elements may be part of the same chip and may be formed over or within the same substrate as the configurable module. In one or more embodiments, the programmable resistance elements and/or threshold switching elements may formed on the same chip as the logic gates of the configurable module.

In one or more embodiments, the logic gates may include CMOS logic gates and/or TTL logic gates. In one or more embodiments, it is possible that the logic gates themselves include OTS elements and/or phase-change elements. In one or more embodiments, the logic gates may exclude OTS elements and/or phase-change elements.

The integrated circuit described herein may, for example, be part of a chip card or smart card. A chip card and/or smart card may, for example, be a programmable card (possibly formed of a plastic) with one or more chips. It may be used, for example, in cashless transactions (such as, for example, credit card, EC card, electronic cash card, phone card, etc.). In one or more embodiments, the chip card and/or smart card may include a micro-controller chip as well as memory components. The memory components may be one the same chip as the micro-controller.

In one or more embodiments, the control elements may be are placed at randomly selected locations within the integrated circuit.

In one or more embodiments, the control circuit may be electrically coupled to the configurable module or to the logic gate by an RC network. In one or more embodiments, the resistance R may be determined by the state of one or more of the control elements which may be part of the control circuit.

In one or more embodiments, the integrated circuit may include a clock signal. The clock signal may trigger the evaluation of the RC network.

In one or more embodiments, the integrated circuit may comprise logic comprising CMOS logic and chalcogenide logic (e.g. logic element implemented as CMOS devices and as chalcogenide devices, like the ones described above). This logic may be spilt in the integrated circuit such that the CMOS logic is formed in the substrate of the integrated circuit and the chalcogenide logic is formed in the dielectric layers of the integrated circuit. This improves the security as the overall logic functionality is difficult to retrieve due to the splitting of the elements.

What is claimed is:

1. An integrated circuit, comprising:
a logic circuit including one or more logic gates; and
a control circuit controlling the logic of the logic circuit, the control circuit comprising one or more control elements, the one or more control elements including at least one programmable resistance element and/or at least one threshold switching element, the one or more control elements being placed at randomly selected locations within the integrated circuit,
wherein at least one of the one or more logic gates comprises a configuration input, and
wherein the one or more control elements are connected to the configuration input of the at least one logic gate so as to control the logic state of the at least one logic gate.

2. The integrated circuit of claim 1, wherein the logic state of the at least one logic gate includes a state selected from the group consisting of disabled state and enabled state.

3. The integrated circuit of claim 1, wherein the enabled state includes a state selected from the group consisting of AND, NAND, OR, and NOR.

4. The integrated circuit of claim 1, further comprising:
a substrate; and
a dielectric layer over the substrate,
wherein the one or more control elements are disposed at least partly within the dielectric layer.

5. The integrated circuit of claim 1, further comprising a self-test controller.

6. The integrated circuit of claim 1, further comprising
an input connected to the control element such that the control element is connected in series between the input and the configuration input,
an output,
a voltage supply,
an inverter connected in series between the configuration input and the output, and
a resistor,
wherein the inverter and the control element are connected in series between the input and the output such that the inverter is connected to the output, and
wherein the resistor is connected between the voltage supply and a node between the inverter and the control element, such that a signal at the input is passed to the output in the enabled state and is blocked in the disabled state.

7. The integrated circuit of claim 1, wherein control circuit disabled the logic circuit.

8. The integrated circuit of claim 1, wherein the integrated circuit is a MOS-device.

9. The integrated circuit of claim 1, wherein said one or more control elements are configured to control the one or more logic gates such that the integrated circuit has a predefined logic functionality.

10. The integrated circuit of claim 1, wherein the integrated circuit is disposed between one or more elements of a circuit, and wherein the one or more control elements are configured to control the one or more logic gates such that a connection between the one or more elements of the circuit is blocked or enabled.

11. The integrated circuit of claim 1, wherein the one or more control elements include at least one programmable resistance element.

12. The integrated circuit of claim 11, wherein the at least one programmable resistance element is at least one phase-change element.

13. The integrated circuit of claim 11, wherein the at least one programmable resistance element is at least one conductive bridging element.

14. The integrated circuit of clam 1, wherein the at least one threshold switching element is at least one ovonic threshold switching element.

15. An integrated circuit, comprising:
a logic circuit including one or more logic gates, and
a control circuit controlling the logic of the logic circuit, the control circuit comprising one or more control elements, the one or more control elements at least one programmable resistance element and/or at least one threshold switching element, the one or more control element placed at randomly selected locations within the integrated circuit,
wherein the one or more logic gates includes an AND-gate having first and a second input terminals, and an output terminal,
wherein the first input terminal of the AND-gate is connected to the control element such that a signal at the second input is passed to the output of the AND-gate in the enabled state and is blocked in the disabled state, and
wherein the state of the control element is fixed to a predefined logic state after manufacturing of the integrated circuit.

16. The integrated circuit of claim 15, wherein the one or more control elements include at least one programmable resistance element.

17. The integrated circuit of claim 15, wherein the at least one programmable resistance element is at least one phase-change element.

18. The integrated circuit of claim 15, wherein the at least one programmable resistance element is at least one conductive bridging element.

19. The integrated circuit of clam 15, wherein the at least one threshold switching element is at least one ovonic threshold switching element.

20. A blocking circuit to be provided between one or more elements of a circuit, comprising:
one or more elements allowing for enabling/disabling a connection between an input and an output of the blocking circuit; and
a control circuit controlling the one or more elements, the control circuit comprising one or more control elements, the one or more control elements comprising at least one programmable resistance element and/or at least one threshold switching element, the one or more control element placed at randomly selected locations within the integrated circuit,
wherein at least one of the elements comprises a configuration input, and
wherein the control element is connected to the configuration input of the at least one element so as to control the at least one element such that a connection between an input and an output of the blocking circuit is enabled or disabled.

21. The integrated circuit of claim 20, wherein the one or more control elements include at least one programmable resistance element.

22. The integrated circuit of claim 20, wherein the at least one programmable resistance element is at least one phase-change element.

23. The integrated circuit of claim 20, wherein the at least one programmable resistance element is at least one conductive bridging element.

24. The integrated circuit of clam 20, wherein the at least one threshold switching element is at least one ovonic threshold switching element.

25. An integrated circuit, comprising:
one or more logic gates; and
one or more control elements controlling the logic states of the logic gates, the one or more control elements comprising at least one programmable resistance element and/or at least one threshold switching element, the one or more control element placed at randomly selected locations within the integrated circuit,
wherein at least one of the logic gates comprises a configuration input, and
wherein the control element is connected to the configuration input of the at least one logic gate so as to control the logic state of the at least one logic gate.

26. The integrated circuit of claim 25, wherein the logic states of each of the logic gates includes an enabled state and a disabled state.

27. The integrated circuit of claim 25, wherein the enabled state is selected from the group consisting of AND, NAND, OR, NOR.

28. The integrated circuit of claim 25, wherein the one or more control elements include at least one programmable resistance element.

29. The integrated circuit of claim 25, wherein the at least one programmable resistance element is at least one phase-change element.

30. The integrated circuit of claim 25, wherein the at least one programmable resistance element is at least one conductive bridging element.

31. The integrated circuit of clam 25, wherein the at least one threshold switching element is at least one ovonic threshold switching element.

32. An integrated circuit, comprising:
a sub-circuit; and
a control circuit comprising one or more control elements, the one or more control elements including at least one programmable resistance element and/or at least one threshold switching element, the one or more control elements placed at randomly selected locations within the integrated circuit,
wherein the sub-circuit comprises a configuration input, and
wherein the control element is connected to the configuration input of the sub-circuit so as to control the state of the sub-circuit, the state being selected from the group consisting of blocked state and enabled state.

33. The integrated circuit of claim 32, wherein said sub-circuit is a logic circuit including one or more logic gates.

34. The integrated circuit of claim 33, wherein the one or more control elements include at least one programmable resistance element.

35. The integrated circuit of claim 33, wherein the at least one programmable resistance element is at least one phase-change element.

36. The integrated circuit of claim 33, wherein the at least one programmable resistance element is at least one conductive bridging element.

37. The integrated circuit of clam 33, wherein the at least one threshold switching element is at least one ovonic threshold switching element.

38. An integrated circuit, comprising:
a logic circuit including one or more logic gates; and
a control circuit controlling the logic of the logic circuit, the control circuit comprising one or more control elements, the one or more control elements including a chalcogenide material, the one or more control elements being placed at randomly selected locations within the integrated circuit,
wherein at least one of the one or more logic gates comprises a configuration input, and
wherein the one or more control elements are connected to the configuration input of the at least one logic gate so as to control the logic state of the at least one logic gate.

39. The integrated circuit of claim 38, wherein the chalcogenide material is a phase-change material.

40. The integrated circuit of claim 38, wherein the chalcogenide material is not a phase-change material.

* * * * *